(12) United States Patent
Funk et al.

(10) Patent No.: US 11,002,810 B2
(45) Date of Patent: May 11, 2021

(54) RF RESONATOR WITH A LENZ LENS

(71) Applicant: Voxalytic GmbH, Karlsruhe (DE)

(72) Inventors: Joerg Funk, Kuesnacht (CH); Peter While, Trondheim (NO); Nils Spengler, Freiburg (DE); Jan Korvink, Karlsruhe (DE)

(73) Assignee: Voxalytic GmbH, Karlsruhe (DE)

( * ) Notice: Subject to any disclaimer, the term of this patent is extended or adjusted under 35 U.S.C. 154(b) by 0 days.

(21) Appl. No.: 16/775,286

(22) Filed: Jan. 29, 2020

(65) Prior Publication Data

US 2020/0217911 A1    Jul. 9, 2020

Related U.S. Application Data

(63) Continuation of application No. 15/196,098, filed on Jun. 29, 2016, now abandoned.

(30) Foreign Application Priority Data

Jun. 30, 2015  (EP) .................................... 15174571

(51) Int. Cl.
   *G01R 33/36*  (2006.01)
   *G01R 33/34*  (2006.01)
(52) U.S. Cl.
   CPC ............. *G01R 33/36* (2013.01); *G01R 33/34* (2013.01); *G01R 33/3642* (2013.01)

(58) Field of Classification Search
   CPC ..... G01R 33/34; G01R 33/36; G01R 33/3642
   See application file for complete search history.

(56) References Cited

U.S. PATENT DOCUMENTS

| | | | |
|---|---|---|---|
| 2005/0171424 A1* | 8/2005 | Brechbiel | A61K 49/124 600/420 |
| 2006/0204443 A1* | 9/2006 | Kobayashi | A61K 47/595 424/9.32 |
| 2008/0007250 A1* | 1/2008 | Wiggins | G01R 33/34084 324/200 |
| 2012/0209541 A1* | 8/2012 | Ong | G01F 1/588 702/45 |

\* cited by examiner

*Primary Examiner* — Paresh Patel
(74) *Attorney, Agent, or Firm* — Paul Vincent

(57) ABSTRACT

A passive magnetic flux focusing element having electrically conductive wires (1) or faces (2) containing an outer area defined by an outer (3), an inner (4) and connecting edges (5) forming a closed current loop enclosing a surface area penetrated by a time varying magnetic field flux and through induction sets up a time varying electrical current in the conducting loop thereby achieving a counter magnetic field to the penetrating field completely canceling the penetrating field in the interior of the loop, is characterized in that the element is part of an RF volume- or surface-coil arrangement adapted for receiving and/or transmitting RF signals. Such elements increase the sensitivity and the SNR in MRI and MR spectroscopy experiments due to an increased magnetic flux density by means of Lenz lenses, in combination with a conventional probe.

17 Claims, 12 Drawing Sheets

PRIOR ART

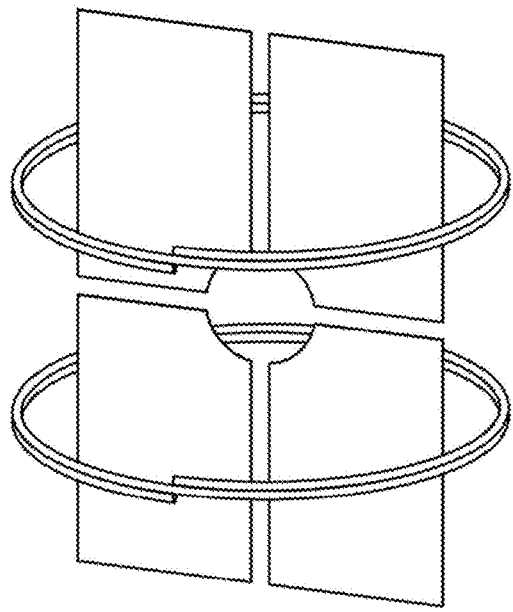
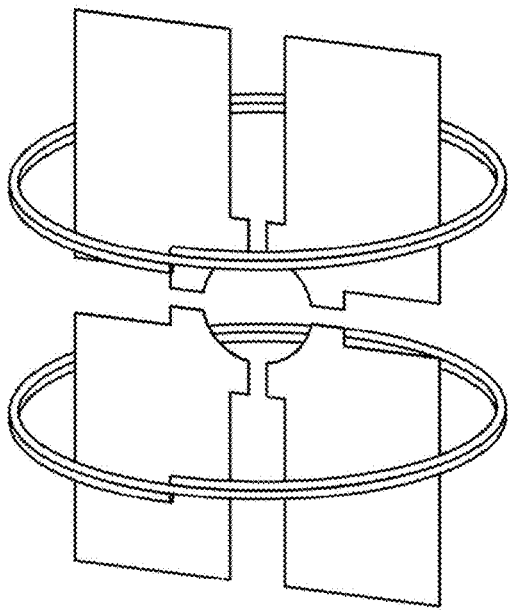
Fig. 15A                Fig. 15B
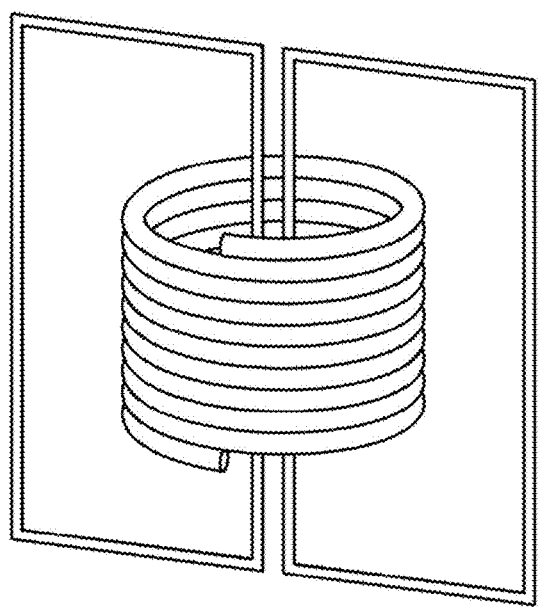
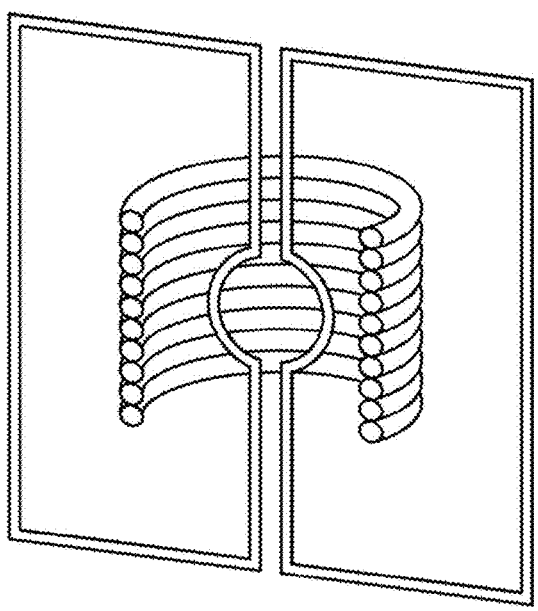
Fig. 16A                Fig. 16B

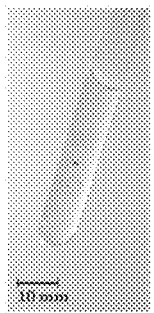 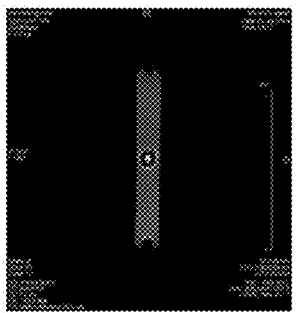 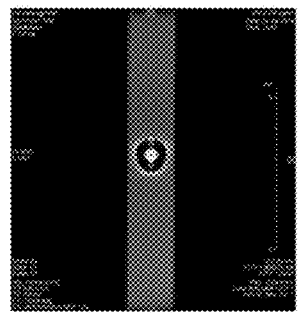 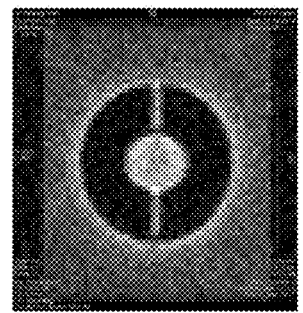
Fig. 19A  Fig. 19B  Fig. 19C  Fig. 19D
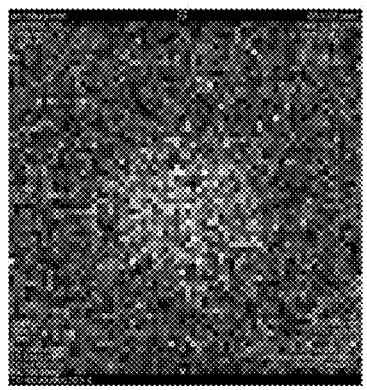 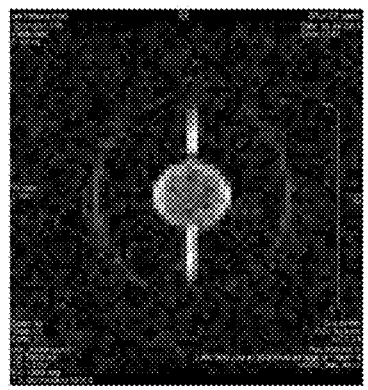 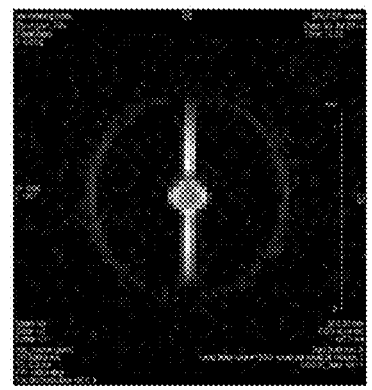
Fig. 20A  Fig. 20B  Fig. 20C

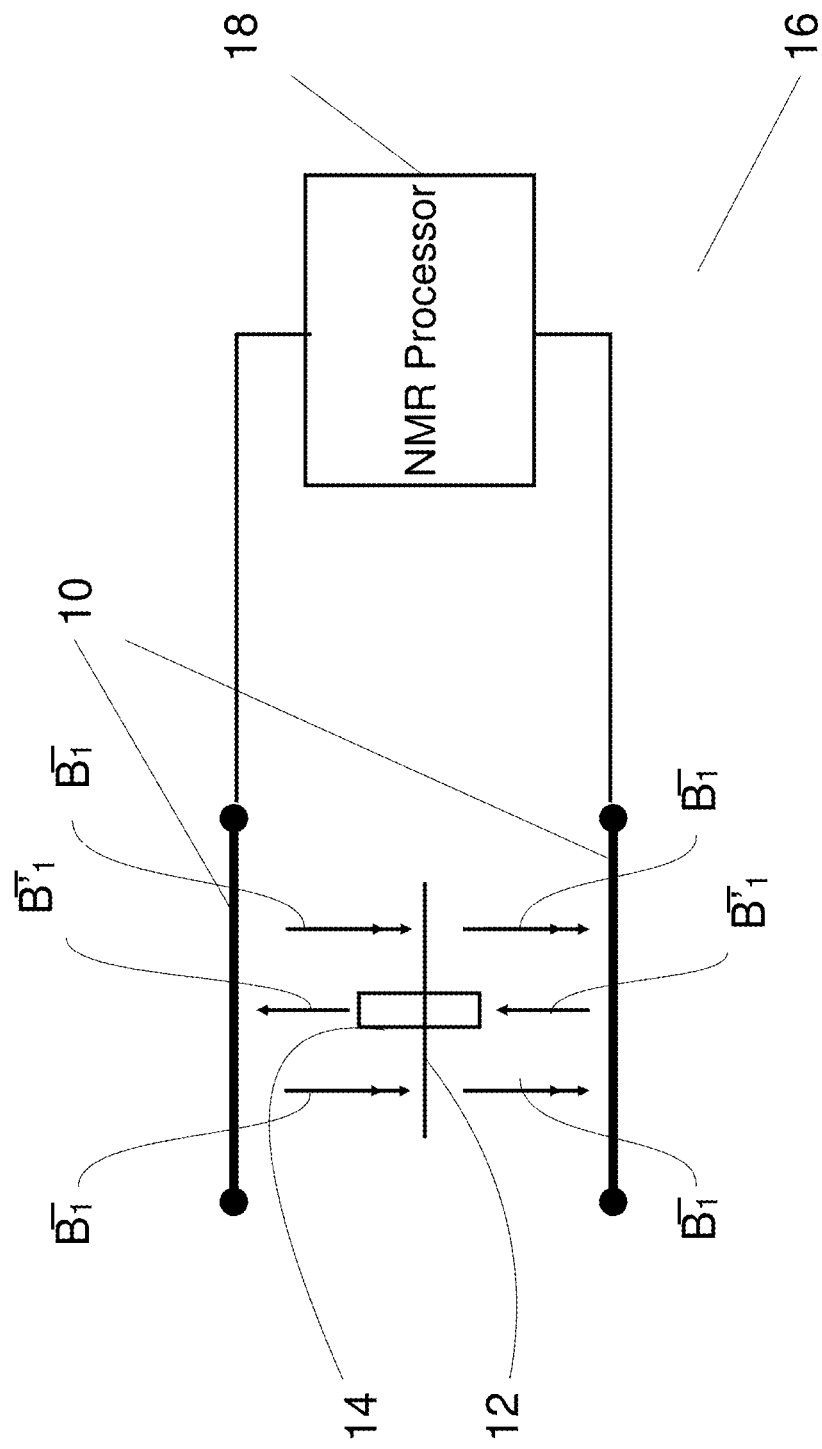

RF RESONATOR WITH A LENZ LENS

This application is a continuation of Ser. No. 15/196,098 filed on Jun. 29, 2016 and claims Paris convention priority from EP 151 745 71.8 filed Jun. 30, 2015, the entire disclosures of which are hereby incorporated by reference.

BACKGROUND OF THE INVENTION

The present invention relates to a passive magnetic flux focusing element (="Lenz lens") comprising electrically conductive wires or faces containing an outer area defined by an outer edge, an inner edge and connecting edges, which in operation form a closed current loop enclosing a surface area penetrated by a time varying magnetic field flux from an electromagnetic field source and through induction sets up a time varying electrical current in the conducting loop so as to achieve a counter magnetic field to the penetrating magnetic field that tends to completely cancel the penetrating magnetic field in the interior of the closed loop, the inner edge of the closed current loop being shaped so as to guide the induced current in the opposite sense to the outside edge, thereby setting up a magnetic field flux in the same sense as the penetrating magnetic flux but of an increased intensity, whereby the resulting time varying magnetic field flux is focused to an area enclosed by the inner edge.

A device of this type, in particular circular shaped, single lens lenses exclusively for flux focusing in the kHz regime, are known from J. Schoenmaker et al., Review of Scientific Instruments, 84:085120 (2013) (=Reference [1]).

The present invention relates to a passive magnetic flux collecting device (="Lenz lens"), to focus, guide, re-direct, or shape a time varying magnetic flux, oscillating at radio frequency (=RF). In particular, the invention pertains every field where an RF magnetic field (=$\overline{B}_1$-field) is present, whose orientation, extent and amplitude needs to be modified by means of a second, passive device. The working principle of the invention relies on Faraday's law of induction and Lenz's law; therefore, the passive flux-focusing device is sometimes denoted as a Lenz lens. Electrical current is induced in the Lenz lens as a consequence of the time-dependent $\overline{B}_1$-field due to Faraday's law of induction, causing an additional magnetic field (=$\overline{B}_1$'-field) that is counteracting the $\overline{B}_1$-field as a consequence of Lenz's law. Due to the geometry of the Lenz lenses, the direction of current is reversed in the center of the lenses, which hence results in a reverted magnetic field as well, amplifying the initial gi-field and effectively concentrating the radiofrequency flux. If the focus area of the lens is tilted or twisted or if multiple lenses are present, the orientation, the shape and/or the extent of the amplified region may be altered.

The present invention further relates generally to magnetic resonance imaging (=MRI) technology. It specifically relates to data acquisition methods for MRI, in particular to the focusing of radiofrequency magnetic flux applicable in the fields of nuclear magnetic resonance (=NMR) imaging and spectroscopy.

Magnetic resonance imaging is a relative new technology compared with computed tomography (=CT) and the first MR Image was published in 1973 by P. C. Lauterbur in "Image Formation by Induced Local Interactions: Examples of Employing Nuclear Magnetic Resonance", Nature 242, 190491. It is primarily a medical imaging technique which most commonly used in radiology to visualize the structure and function of the body. It could provide detailed Images of the body in any plane. MRI provides much greater contrast between the different soft tissues of the body than CT does, making it especially useful in neurological, cardiovascular, and oncological imaging. It uses a powerful magnetic field to align the nuclear magnetization of hydrogen atoms in water in the body. Radio frequency fields are used to systematically alter the alignment of this magnetization, causing the hydrogen nuclei to produce a rotating magnetic field detectable by the scanner. This signal can be manipulated by additional magnetic fields to build up enough information to reconstruct an image of the body.

An MRI system typically establishes a homogenous magnetic field, generally along a central axis of a subject undergoing an MRI procedure. This homogenous main magnetic field affects the magnetic properties of the subject to be imaged by aligning the nuclear spins, in atoms and molecules forming the body tissue. If the orientation of the nuclear spins is perturbed out of alignment, the nuclei attempt to realign their spins with the field. Perturbation of the orientation of the nuclear spins is typically caused by application of radio frequency (RF) pulses tuned to the Larmor frequency of the material of interest. During the realignment process, the nuclei precess about the direction of the main magnetic field and emit electromagnetic signals that may be detected by one or more RF detector coils placed on or around the subject.

Magnetic resonance imaging employs temporally and spatially variable magnetic fields to encode position by affecting the local Larmor frequency of spins. Gradient coils typically used for that purpose generate spatial encoding magnetic fields (=SEMs) which are superimposed on the main magnetic field. This allows to choose the localization of the image slices and also to provide phase encoding and frequency encoding. This encoding permits identification of the origin of resonance signals during image reconstruction. The image quality and resolution depends significantly on the strength and how the applied encoding fields can be controlled. Control of the gradient coils is generally performed in accordance with pre-established protocols or sequences at events, called pulse sequences, permitting different types of contrast mechanisms to be imaged.

More specifically, the present invention relates generally to RF applications such as magnetic resonance imaging (=MRI) and magnetic resonance (=MR) spectroscopy. It specifically relates to the enhancement, redirection or re-shaping of an existing RF magnetic field such as the one created by a probe used in MR spectroscopy and MRI.

Both methods, MRI and MR spectroscopy, suffer from an inherently low limit of detection (=LOD) being several orders of magnitude worse than other analytical techniques. In his publication "Radiofrequency microcoils in magnetic resonance", Progress in Nuclear Magnetic Resonance Spectroscopy 31:1-42 (1997) (=Reference [2]), A. G. Webb states an LOD of $5 \times 10^{-9}$ mol for MR spectroscopy, while, e.g., infrared spectroscopy has an LOD of $10^{-12}$-$10^{-15}$ mol and mass spectrometry has an LOD of $10^{-19}$ mol. In MRI, this fact becomes even more severe, as, in contrast to MR spectroscopy, the total volume of interest (=VOI) is again divided into sub-volumes (voxels) and therefore, the LOD holds true for each voxel rather than for the total VOI. This fact leads to long scanning times in MRI microscopy and MR spectroscopy if either high spatial resolution is required or if the sample concentration is low.

MRI and MR spectroscopy both require, besides a strong static magnetic field, an RF magnetic field to alter the orientation of the magnetic spin polarization, created by the static magnetic field the sample is exposed to. Such an RF magnetic field is generated by some sort of coil, more generally termed as the probe, and is typically denoted as the $\overline{B}_1$-field, while the sensitivity of the probe is defined as the $\overline{B}_1$-field divided by the unit current i as in $\overline{B}_1/\overline{I}$ as outlined by D. I. Hoult an R. E. Richards in "The signal-to-noise ratio of the nuclear magnetic resonance experiment", Journal of Magnetic Resonance 24:71-85 (1969) (=Reference [3]).

The authors in Reference [3] recognized an inversely proportional relationship between the sensitivity $\overline{B}_1/\overline{I}$ and the diameter of common probe geometries such as the solenoid or the saddle coil, as the flux density per unit current increases for a decreasing coil diameter. This fact was verified experimentally by T. L. Peck et al., in "Design and Analysis of Microcoils for NMR Microscopy", Journal of Magnetic Resonance, Series B 108:114-124 (1995) (=Reference [4]), where a series of solenoidal microcoils down to diameters of 50 µm were fabricated and where the authors showed increasing sensitivities for decreasing diameters. Consequently, a large variety of probes exist that are conformal to the sample (body parts in MRI, or materials in MR spectroscopy). As an example, the 0.47 mm outer diameter solenoidal probe of D. L. Olson et al., reported in "High-Resolution Microcoil NMR for Analysis of Mass-Limited, Nanoliter Samples", Science 270:1967-1970 (1995) (=Reference [5]) yielded a 130-fold sensitivity enhancement compared to a conventional 10 mm diameter saddle coil.

By locally increasing the sensitivity and hence the signal-to-noise ratio (=SNR), higher levels of detail can be achieved in MRI for a comparable scanning time, or, the same level of details is achieved for a shorter scanning time. In MR spectroscopy, an increased sensitivity results in an increased spectral resolution meaning that chemical compounds, which would otherwise vanish in the noise of the signal, will be identifiable.

However, decreasing the probe's dimensions is only one of several ways to increase the flux density per unit current in order to achieve a higher sensitivity.

The present invention aims at presenting a way to substantially overcome one or more of the disadvantages in the existing methods of prior art discussed above.

More specifically, the invention will present a novel device for focusing of magnetic fields for applications in the radio frequency regime.

In particular, the present invention will present an alternative way to increase the sensitivity and hence the SNR in MRI and MR spectroscopy experiments due to an increased magnetic flux density by means of one or more Lenz lenses, in combination with a conventional probe.

Besides focusing the flux, specific objects of the invention are to guide, shape or redirect the RF magnetic field created by the probe using such lenses, including a combination of the proposed objects.

Fabricating such lenses from flexible materials further enables placing them on irregular-shaped samples, which enables screening of such samples at the highest possible resolution.

A further object of the invention is an analytical model to describe the behaviour of Lenz lenses exposed to an RF magnetic field like it is the case in MRI and MR spectroscopy.

SUMMARY OF THE INVENTION

These objects are achieved by modifying the device discussed above in that the magnetic flux focusing element is part of an RF (=Radiofrequency) volume or surface coil arrangement adapted for receiving and/or transmitting RF signals.

Specifically, the above objects of the present invention are achieved by placing Lenz lenses on the object of interest and is therefore placed in between this object and the RF coil. More specifically the Lenz lens is placed at the region of interest, perpendicular to the orientation of the magnetic field $\overline{B}_1$, created by the RF coil of the nuclear magnetic resonance (=NMR) scanner.

A Lenz lens is a closed loop metallic short-circuited wire-like structure, with an enclosed area $A_{LL}$, that is placed within the intense magnetic field region of an NMR excitation and detection coil, with its surface normal oriented parallel to the direction of the NMR coil's magnetic flux $\overline{B}_1$. For magnetic resonance applications, the lens is placed close to the sample whose signal is to be acquired.

Furthermore, the magnetic flux of the coil should pass through the lens everywhere in the same sense, to avoid unwanted cancellation of induced current. The time-dependent, RF magnetic flux $\overline{B}_1$ of the MR coil induces a current i' in the Lenz lens's conductor proportional to the enclosed area $A_{LL}$ defined by the outer radius rbig, and according to Lenz's law, the Lenz lens acts to set up a current that exactly compensates the flux in the interior of the loop of the lens. The shape of the lens conductor, however, is arranged such that the current is forced to follow a path that also forms an implied opposite sense loop of much smaller area $A_f < A_{LL}$ than the enclosed Lenz lens area, defined by rsmall. Since this smaller loop's area is outside of the enclosed area of the Lenz lens loop, the magnetic field that is induced in this domain is again in the same sense as the enclosing NMR coil's B field, but now of a much higher value. The current i' set up in the Lenz lens induces a higher magnetic field over the enclosed area of the smaller loop, serving to effectively focus all of the magnetic flux that was compensated in the interior region of the Lenz lens into this smaller loop area.

To summarize, the Lenz lens weakens the RF magnetic field of the coil in the area $A_{LL}$, as it's magnetic flux has an opposite direction in that region, while it strengthens the RF magnetic field of the coil in the area Af, where it's flux has the same orientation as the one of the coil, which results in an increased net magnetic flux density by means of superposition. The Lenz lens effectively acts as a magnetic field "lever".

A key point in the present disclosure is the recognition of the validity of the principle of reciprocity also for Lenz lenses. From this identification and association, a range of novel applications of Lenz lenses arise. In the principle of reciprocity, one recognizes the equivalence of the following two cases: A time varying current i in a conductor (as effector) produces a time varying magnetic field pattern $\overline{B}_1$. Inversely, the same time varying magnetic field pattern $\overline{B}_1'$ as effector produces the same time varying current i in the conductor. The reciprocity means that the conductor can be once and for all characterized by a forward computation, i.e., by inducing a unit current i in the wire, one obtains the per current magnetic induction $\overline{B}_1$ that describes the spatial sensitivity for both forward and inverse effects.

Because the reciprocity principle also holds for Lenz lenses, this implies that Lenz lenses aid in increasing the localized sensitivity to a magnetic resonance excitation, effectively turning a Faraday induction magnetic resonance detector with a larger typical detection length scale into a magnetic resonance microscope with a length scale of the order of the gap size of the Lenz lens.

As this is a broad band device, it works for samples independent of the resonance frequency of the excitation field, thus facilitating the study of samples through a range of magnetic field strengths.

If the interior region of the lens is tilted with respect to the outer region, the resulting field is tilted as well in the same orientation, which enables the arbitrary rotation of the field's orientation.

Placing multiple lenses in parallel will lead to an elongated focused field volume, rather than in a focal area. If spaced correctly, the resulting field volume shows a high field homogeneity.

If Lenz lenses are patterned on flexible materials such as a foil, or if the lenses are made from flexible material such as wire, it may be wrapped around the sample to accommodate it.

Since many NMR detectors also exhibit fields outside of their primary region of interest, it is possible to conceive of an arrangement for the lenses that also collects this flux. In order to do so, the lens can no longer be purely planar, but requires a cross-over loop so as to collect the outer flux with the correct sense, since the detector's outer gi field will point in the opposite direction as it closes the magnetic field line loops. Especially for Helmholtz type coil arrangements, where the lens outer loop is ideally of a similar size to the Helmholtz loop, such an arrangement is very advantageous, because up to 50% more flux can thus be collected.

In a particularly preferred embodiment of the invention, the RF-coil arrangement is part of an MR (=Magnetic Resonance) apparatus, in particular a saddle (="Helmholtz") coil, a planar spiral coil, a solenoidal coil, a microslot, a birdcage, or a stripline resonator.

The advantage of applying the Lenz lens is to avoid constructing the RF coil with a technologically disadvantageous dimension. Instead, the Lenz lens is used to bridge the length scale. Being straightforward to manufacture, it greatly simplifies the controlled focusing of RF flux.

In a further and preferred embodiment of the invention, the magnetic flux focusing element is attached on a flexible, adhesive or non-adhesive substrate such as a foil that allows for bending, twisting, or to be wrapped around an object in a permanent or non-permanent manner. The advantage of using a flexible substrate is that the Lenz lens can be employed in geometrically awkward situations, or with geometrically complex samples, and still achieve the flux focusing advantage of the Lenz lens.

In a further and preferred embodiment of the invention, the focal spot of the Lenz lens is split into multiple spots and/or the collecting area of the Lenz lens is split into multiple segments. The advantage if this embodiment is the ability to selectively achieve the flux focusing effect of the Lenz lens in a set of regions of interest in parallel. In addition, regions that should not experience a flux focusing, or also, that should experience a flux reduction, can thus be accommodated for.

In a further and preferred embodiment of the invention, the outer edge and inner edge lie on different geometrical planes being parallel or not parallel to one another. The advantage of this embodiment is to achieve the Lenz lens flux focusing effect in another plane than the plane that contains the flux collecting part of the Lenz lens, thereby accommodating samples or applications that require more general geometrical situations.

In a further and preferred embodiment of the invention, the outer edge and or the inner edge describe a different geometrical shape, in particular a rectangle or a triangle. The advantage of this embodiment is that the shape and position of the area that flux is being collected for the Lenz lens effect can be precisely specified. A further advantage is that multiple Lenz lenses can thereby be placed side-by-side to effectively tile a surface.

In a further and preferred embodiment of the invention, the magnetic flux focusing element is fabricated using bio-degradable materials such as silk or magnesium and wherein the surface of the magnetic flux focusing element is coated with a bio-compatible material such as Parylene allowing for long-term tolerance to be implanted into an arbitrary sample or patient. The advantage of this embodiment is that the Lenz lens can be used in vivo rather than only on the outside of living organisms.

In a further and preferred embodiment of the invention, the focus region of the Lenz lens is enclosed by a coil- or waveguide resonator, creating a magnetic field $B_2'$ that is oriented perpendicular to the field created by the resonator $B_1$, while the outside region, i.e., the flux-collecting region of the Lenz lens is exposed to a second magnetic field $B_2$ besides the one of the coil- or waveguide resonator, oscillating at microwave frequencies. The Lenz lens in such an arrangement is capable of guiding the flux created by the millimeter waves inside the resonator, although the resonator itself may shield its interior from the microwave field, which is especially the case for closed geometries such as a solenoidal coil. In order to minimize additional capacitive contributions from the Lenz lens, the spacing of adjacent current conducting faces or wires may be increased.

In a further and preferred embodiment of the invention, magnetic flux is also collected from outside of the enclosing coil. Because this flux will be pointing in the opposite sense as the enclosed flux, the Lenz lens conductor loop pattern for the outside region will join the interior conductor pattern with a 180° twist of the wires, so as to preserve the sense of the induced current as required by the inner loops. It requires a non-planar technology to realize such a Lenz lens, since the conductors have to cross without short circuit.

In a further and preferred embodiment of the invention, the sample and focusing element is either placed into the rotor of a magic angle spinning (MAS) turbine, or placed into the coil of a magic angle coil spinning (MACS) (see References [9], [10]), which in turn is placed into the rotor of a magic angle spinning (MAS) turbine. The advantage of this embodiment is that, given the need to maintain MAS turbines to have a diameter as small as possible, yet with relatively large wall thicknesses to render them robust enough (so as to not transgress the limit of mechanical strength) for the very fast rotation speeds at 110 kHz and more, the RF coil is necessarily relatively distanced from the sample contained in the MAS rotor, and Lenz lenses can therefore provide the RF lever to bring the flux at high density to the sample.

In a further and preferred embodiment of the invention, the magnetic flux focusing element is formed by depositing a sufficiently thick metal film onto a suitable substrate and patterning it to form the desired metal shape. The patterning of the metallic film can be achieved by a variety of methods. For example, the pattern can be created by conventional photolithography and subsequent etching of a continuous metallic film. In this case, the metallic film can be formed by sputtering, evaporation, or deposition of metal onto the substrate. The etching can be performed directly by using a suitable metal etchant, or indirectly by selective oxidation of the metallic film, thereby selectively removing the film's conductivity.

It is also possible to form the metallic film by direct write technologies. For example, the film can be produced by inkjet printing of metal nanoparticles followed by low temperature sintering of the particles to form a continuous film, or from the solution by printing a suitable precursor chemical followed by subsequent thermal processing. If the film thus formed is insufficiently thick, the film thickness can be increased by subsequent processing, for example, by galvanic growth of a thicker film.

The film can be formed on a variety of substrates. The substrates should not be conductors of electricity. Thus the following materials, but not limited to these materials, are good substrates: glass, paper, polymers, plastics, woven cloth. The substrates may be rigid, or may be flexible.

A further and preferred implementation of the invention comprises a set of two or more magnetic flux focusing elements according to the invention, wherein an array of such magnetic flux focusing elements is placed above, below or next to each other (i.e., in different planes or in the same plane). One advantage of this embodiment is the ability to influence the uniformity of the flux focusing effect of the Lenz lens, for example by forming a Helmholtz pair of Lenz lenses. Another advantage is the ability to form a pattern of field intensities by using different lever ratios for each of the array elements of the Lenz lens array, thereby achieving a graded or other flux intensity profile.

Another and preferred implementation of the invention comprises a set of two magnetic flux focusing elements according to the invention, which are placed at non-zero angles to each other, with shared focal regions, so as to focus impinging fields that are incident to the resulting system from multiple directions, including circularly polarized waves. An advantage of this embodiment is the ability to create a Lenz lensing effect for the quadrature components of an RF field at the same time, or to be able to achieve the Lenz lensing effect for an RF field that is rotating with respect to the plane formed by the normals to the inner loops of the two flux focusing elements.

Furthermore, a method of producing a magnetic flux focusing element according to invention is preferred, wherein a mathematical equation or a system of equations is used to calculate the current induced in one or more of the magnetic flux focusing elements for the purposes of simulation and/or optimization, wherein said equation or system of equations exactly or approximately accounts for the electrical resistances and self-inductances of the conductors comprising the Lenz lens(es), including skin-effects that may be relevant for high frequency applications, and exactly or approximately accounts for the mutual inductances between the conductors comprising the Lenz lens(es) and also the mutual inductances between the Lenz lens(es) and an NMR coil and wherein said equation or system of equations are dependent on the frequency of the impinging field. An advantage of this method is to make the effect of a particular Lenz lens arrangement predictable and therefore useful for the design of custom Lenz lens embodiments.

Also, an inverse method to calculate the best arrangement of the magnetic flux focusing element according to the invention is beneficial, which is based on a forward method to compute the fields of a Lenz lens, such as in the previous claim, together with a scalar objective function $O(i,B_1)$, which is an expression whose value ideally vanishes when the Lenz lens has the best arrangement. Such an optimization method can compute the best direction of a improvement, by taking the derivative of the objective function with respect to geometrical or topological modifications of the Lenz lens layout, and iteratively performs modifications of the Lenz lens in directions that reduce the value of the objective function.

These, as well as other objects and advantages of this invention can be better understood and appreciated through careful study of the following detailed description of presently preferred exemplary embodiments of this invention in conjunction with the accompanying drawing.

In order to make the aforesaid and other features and advantages of the present invention more apparent to those skilled in the art, preferred embodiments of the present invention will be described in detail below by referring to the accompanying drawings, wherein identical numerals represent the same parts.

BRIEF DESCRIPTION OF THE DRAWING

FIG. 6B illustrates the orientation of induced currents and magnetic fields of two parallel Lenz lenses exposed to the magnetic field of a Helmholtz coil pair.

In FIG. 11B, the focus region is displaced out-of-plane while in FIG. 11C, the orientation of $\bar{B}_1'$ is additionally rotated at an angle ≠90°.

FIGS. 15A, 15B, 16A and 16B illustrate a Lenz lens enclosed by an open- or closed-geometry coil resonator. In FIG. 15B, the spacing among adjacent current conducting faces has been increased to minimize capacitive losses, in contrast to FIG. 15A. A sliced view of the solenoidal arrangement of FIG. 16A is illustrated in FIG. 16B.

FIGS. 19A to 19D illustrate a Lenz lens patterned on a water-filled, rectangular shaped capillary by means of electro-deposition of Gold. The lens was placed in a 10 mm NMR tube and embedded in agarose gel, consisting of 1.5 wt. % agarose in D2O (FIG. 19A) and therefore invisible in MRI. The tube was loaded into a saddle-shaped coil with the orientation of the lens plane perpendicular to the direction of magnetic ux. FIGS. 19B to 19D illustrate the flux focusing effect of the lenses at different magnifications in MRI, i.e., creating localized hotspots with increased sensitivity.

FIGS. 20A to 20C illustrate a series of MRI measurements at 67 dB attenuation (0.5 W power) using a 1.2 mm diameter Helmholtz coil pair. The acquisition parameters were identical for all MRIs. The first MRI (FIG. 20A) shows a reference measurement of a water phantom without a lens, while FIGS. 20B and 20C illustrate a measurement using a wire based, double Lenz lens with 1 mm outer diameter, a spacing of 0.1 mm between both lenses and inner diameters of 0.4 mm (FIG. 20B) and 0.2 mm (FIG. 20C), respectively. Clearly, the image contrast is higher in the cases where a Lenz lens is present compared to the reference scan due to the increased SNR as a result of the flux focusing effect caused by the lenses.

DESCRIPTION OF THE PREFERRED EMBODIMENT

Figure 1A:
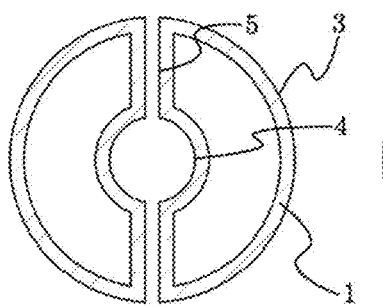
FIGS. 1A and 1B show two possible layouts, where the first layout (FIG. 1A) is made of wire material 1 while the second layout (FIG. 1B) is made of solid metal faces 2. The common representation of either case is illustrated in FIG. 1C. The amplification of the lens is related to the ratio between the outer loop radius $r_{big}$ and the inner loop radius $r_{small}$.
Figure 1B:
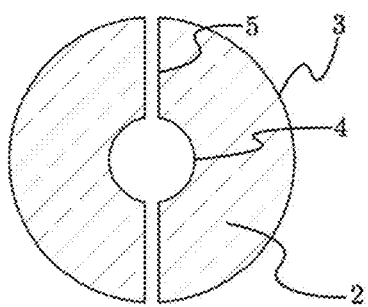
Figure 1C:
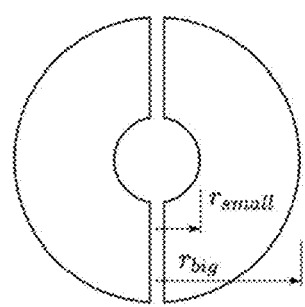
Figure 2A:
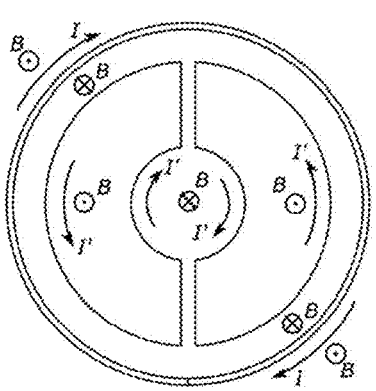
FIGS. 2A and 2B illustrate the orientation of the driving current $\bar{I}$, induced currents $\bar{I}'$ and magnetic fields B of the Lenz lens (i.e., not magnitudes) shown in FIG. 1C, exposed to the magnetic field in between a Helmholtz coil pair.
Figure 2B:
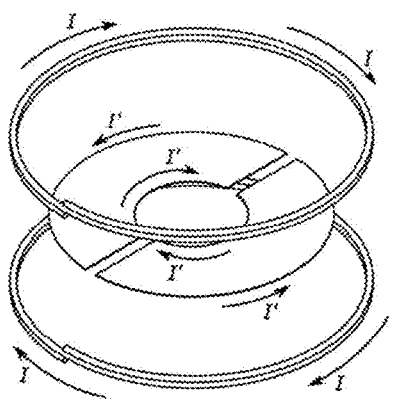
Figure 3A:
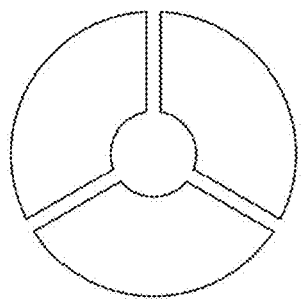
FIGS. 3A to 3F illustrate design parameters such as the segmentation of the outer area, the width of the slits, the relocation of the focus or the splitting into multiple focal spots.
Figure 3B:
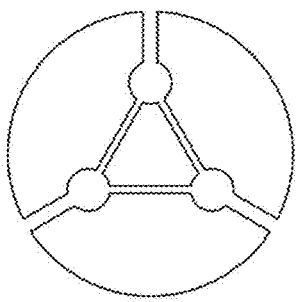
Figure 3C:
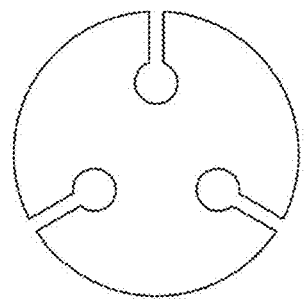
Figure 3D:
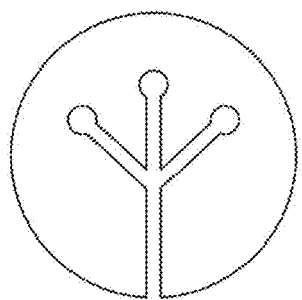
Figure 3E:
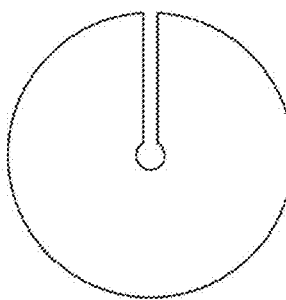
Figure 3F:
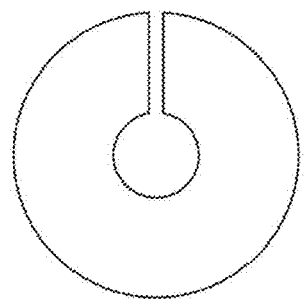
Figure 4A:
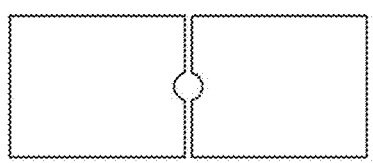
FIGS. 4A to 4D illustrate various possible shapes and aspect ratios.
Figure 4B:
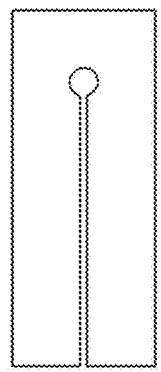
Figure 4C:
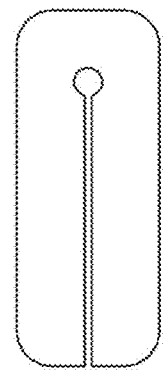
Figure 4D:
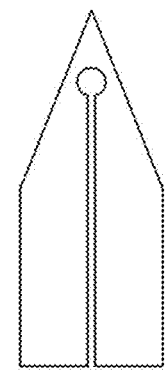
Figure 5:
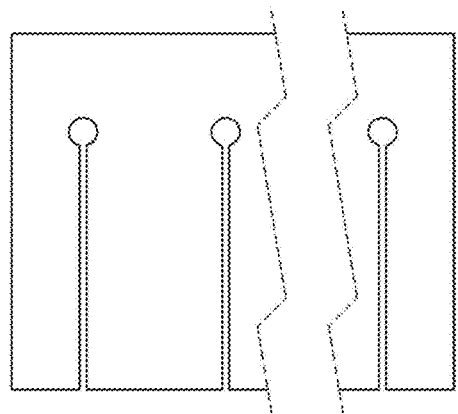
FIG. 5 illustrates an array of elements on one substrate.
Figure 6A:
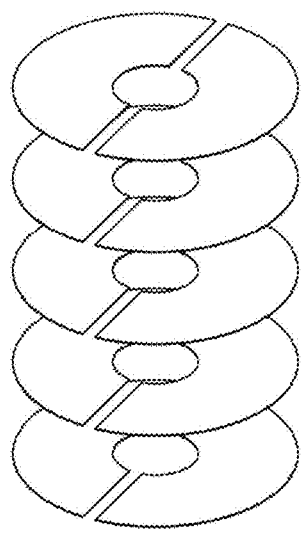
FIGS. 6A and 6B illustrate an array of elements on different substrates (arbitrary slit position).
Figure 6B:
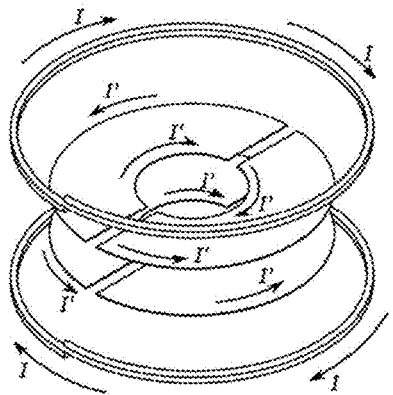
Figure 7A:
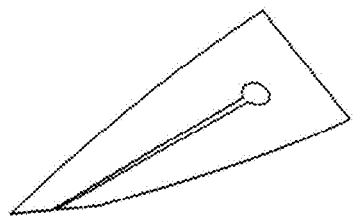
FIGS. 7A to 7C illustrate a Lenz lens on a flexible substrate, bent and twisted in different directions.
Figure 7B:
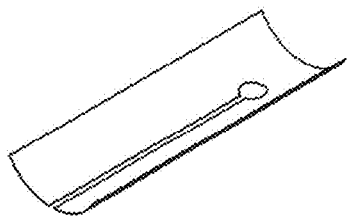
Figure 7C:
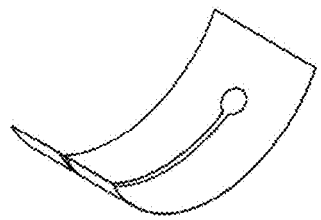
Figure 8A:
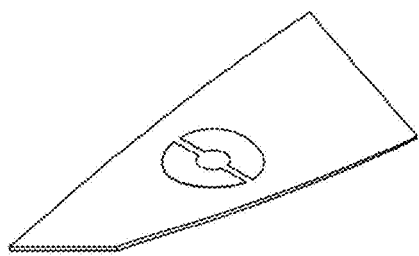
FIGS. 8A to 8C illustrate Lenz lenses on adhesive substrates, attached to different objects.
Figure 8B:
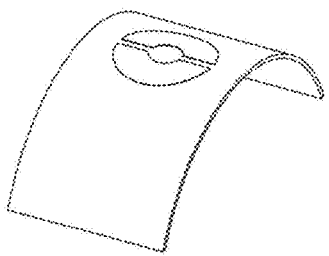
Figure 8C:
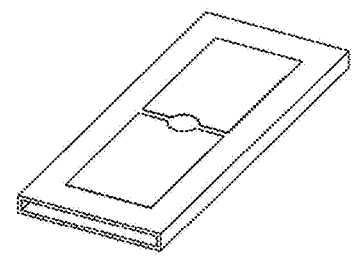
Figure 9A:
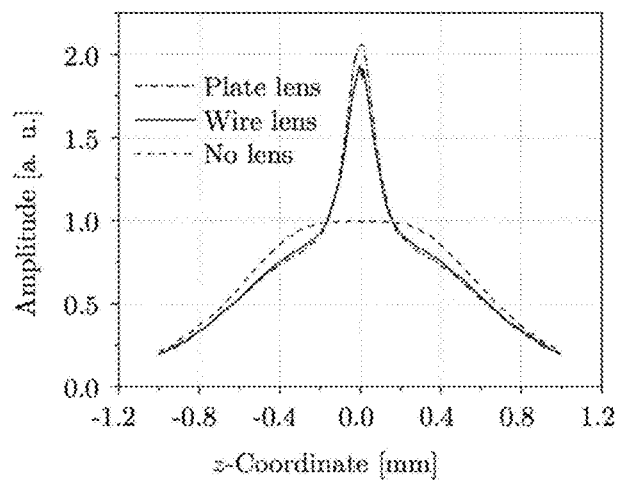
FIG. 9A illustrates the magnetic flux density along the axis of symmetry z in case of a Helmholtz coil pair without a Lenz lens, and in cases of a wire-based and of a plate-based single Lenz lens, sketched in FIG. 9B.
Figure 9B:
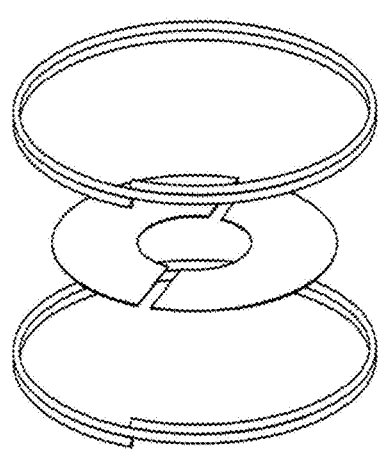
Figure 10A:
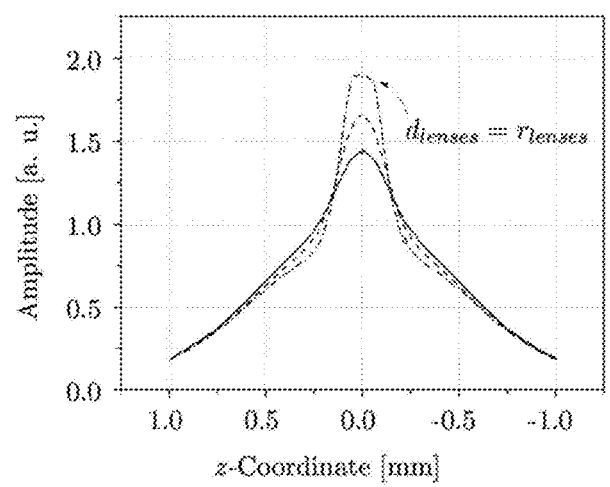
FIG. 10A illustrates the magnetic flux density along the axis of symmetry z in case of a Helmholtz coil pair with a wire-based double Lenz lens for increasing inner diameters and a fixed spacing, sketched in FIG. 10B.
Figure 10B:
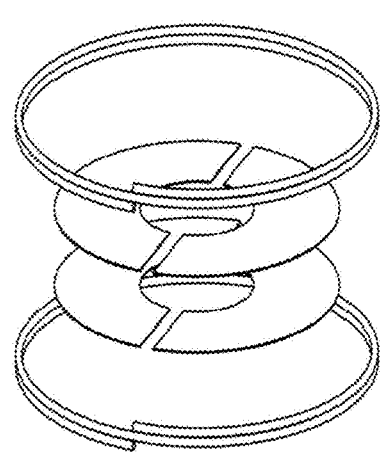
Figure 11A:
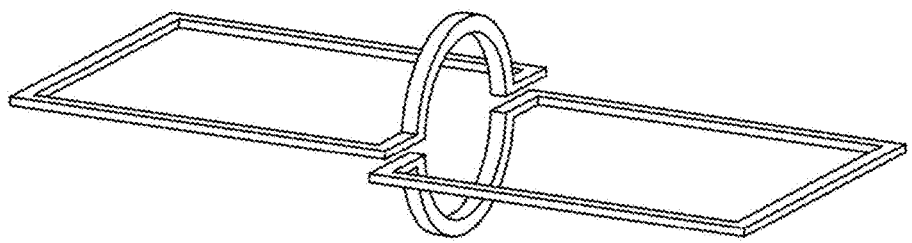
FIGS. 11A to 11C illustrate three different arrangements, where the inner element of a Lenz lens is rotated with respect to the outer element and/or located on a different plane. For FIG. 11A, the resulting magnetic field $\bar{B}_1'$ is rotated about 90° with respect to the incident field $\bar{B}_1$.
Figure 11B:
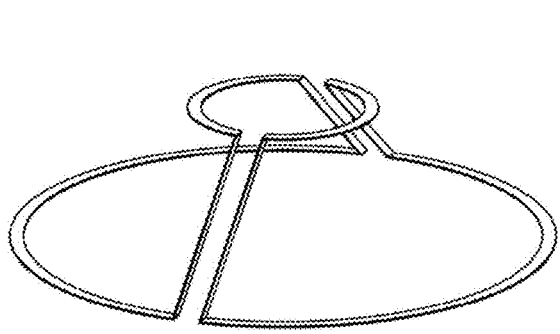
Figure 11C:
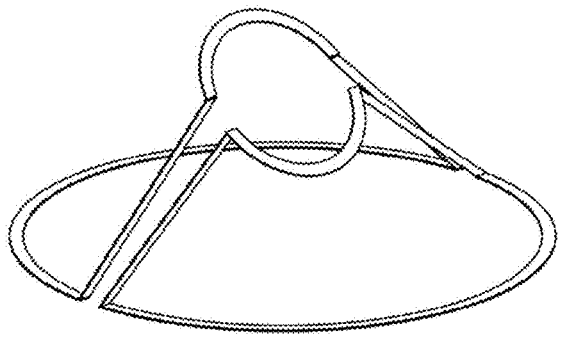
Figure 12A:
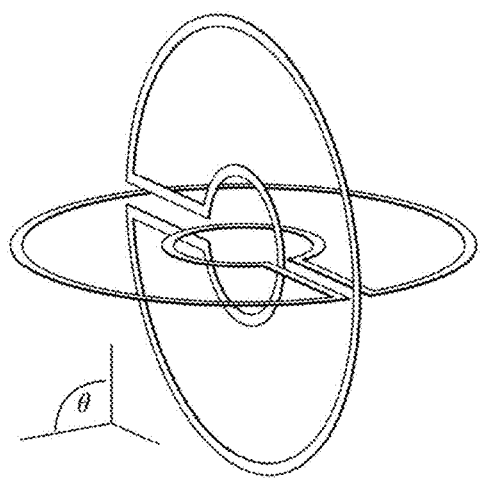
FIGS. 12A and 12B illustrate two different arrangements, where either two Lenz lenses are placed mutually perpendicular (FIG. 12A) or at an angle θ≠90° (FIG. 12B). This arrangement is easy to assemble, as the two Lenz lenses slide into each other while in FIG. 12A, additionally conserves any incident circular polarization along the slit axis.
Figure 12B:
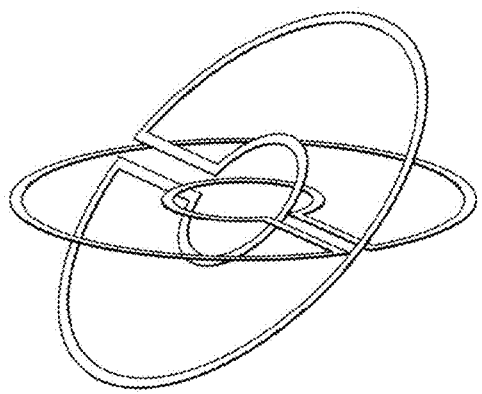
Figure 13A:
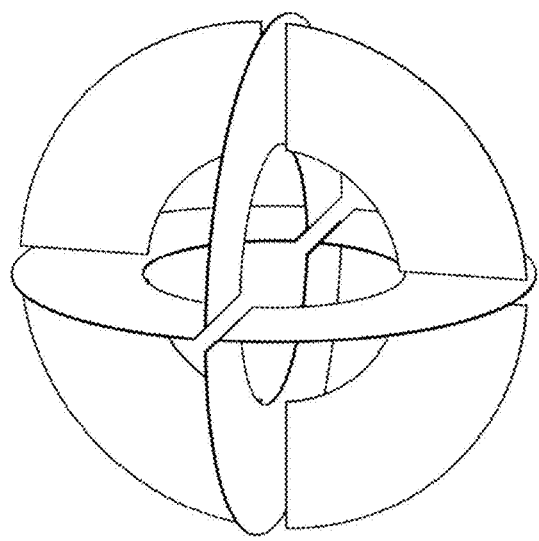
FIGS. 13A and 13B illustrate an arrangement where three Lenz lenses are placed mutually perpendicular. The arrangement permits complete conservation of any incident field.
Figure 13B:
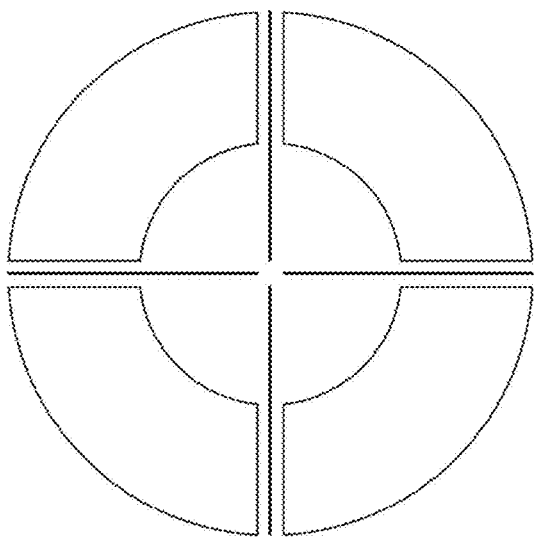
Figure 14A:
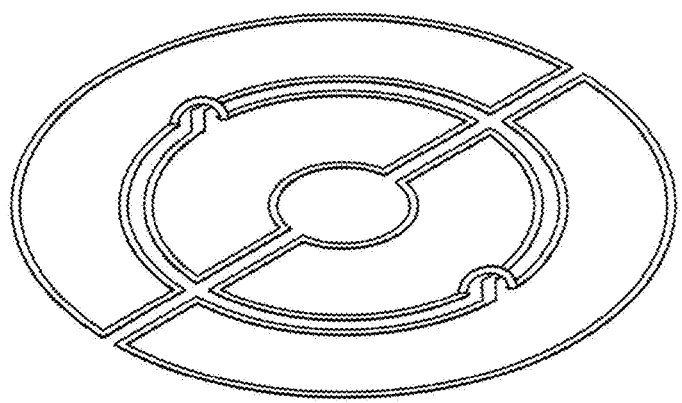
FIGS. 14A and 14B show an arrangement that also collects flux from outside of an enclosing Helmholtz coil. The outer flux collector injects its current in the opposite sense into the inner Lenz lens, thereby focusing also this flux into the inner region. The crossover points require nonplanar technologies, such as wire bonding, for realization.
Figure 14B:
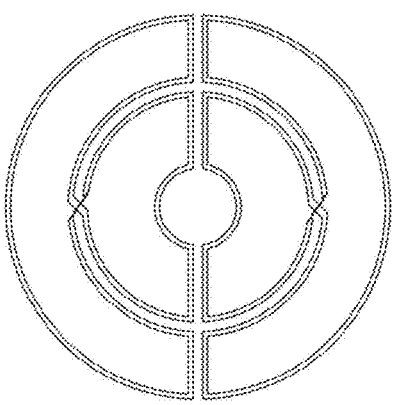
Figure 17:
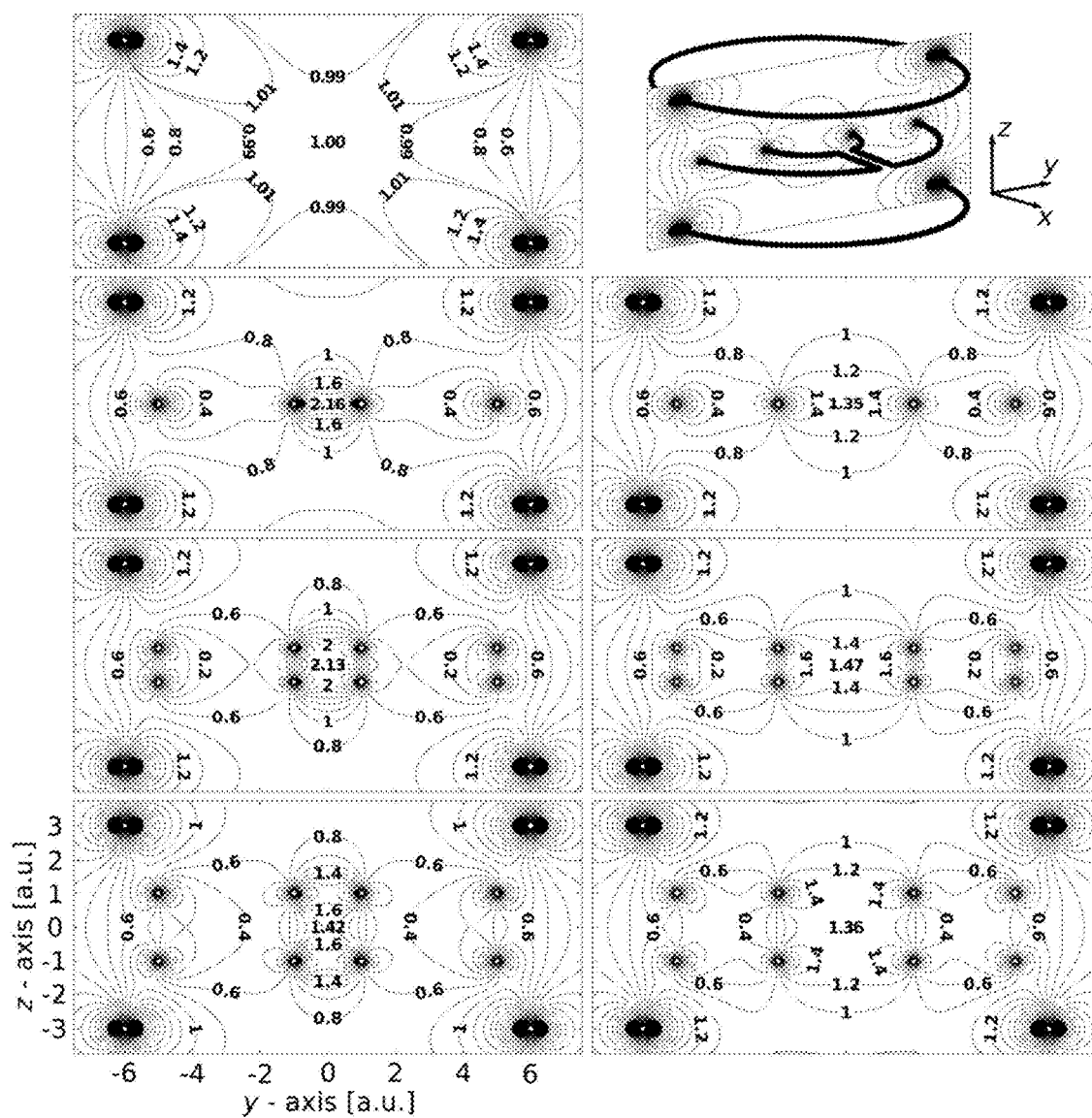
FIG. 17 shows the $B_z(0,y,z,t)$-field induced by a Helmholtz pair and a variety of different lenses: i.e., zero, one or two lenses of different inner loop size and/or lens spacing. The numbers depict the relative field strength of the corresponding contour, normalized to the iso-centre value of the case without a lens. The contour plots are all plotted on the yz-plane as depicted in the illustrative example at the upper right of the figure.
Figure 18:
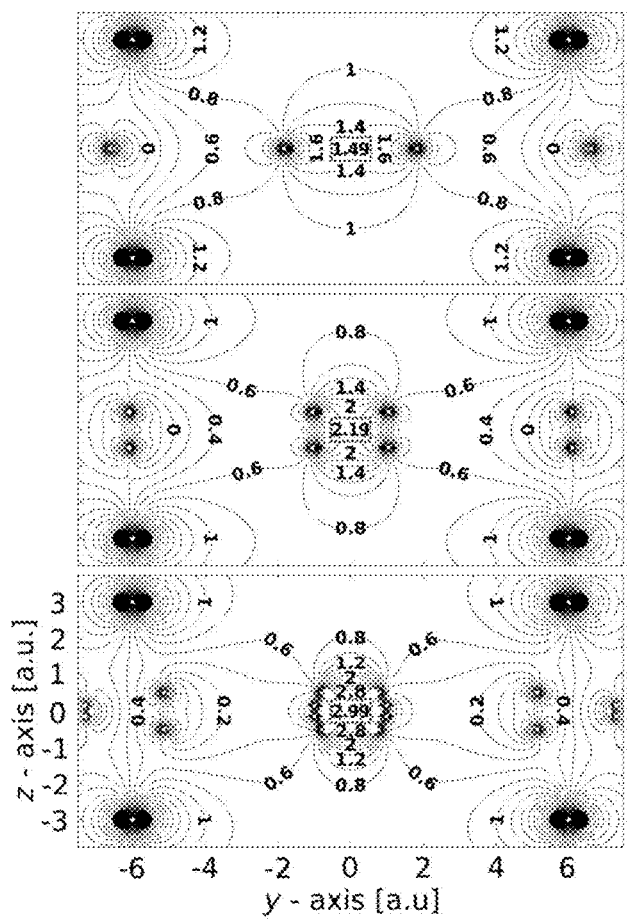
FIG. 18 shows the $B_z(0,y,z,t)$-field induced by three optimized systems consisting of a Helmholtz pair and either one, two or four lenses. The size and position of the lens elements have been optimized to maximize the gain within a cylindrical volume, depicted in the yz-plane by the small dashed rectangle, whilst constraining the average field distortion to be 1% within this region of interest. The numbers depict the relative field strength of the corresponding contour, normalized to the iso-center value of the case without a lens. The example with four lenses exhibits a threefold gain in field sensitivity.

In this disclosure, a device is proposed to increase the flux density of an NMR detector, thereby achieving a higher localized intensity of RF excitation (the Pi-field), and by the principle of reciprocity, a higher detection sensitivity or SNR.

Recently, a method was published which demonstrated the ability to focus the field strength within a Helmholtz coil in a localized region (see Reference [1]). Whereas the explanation in the paper is broadly correct, an assumption presented in the paper is incorrect, leading to an incorrect prediction of the flux concentration. Furthermore, the paper exclusively describes the effect, while omitting an actual application. The paper especially fails to recognize the potential of the concept in nuclear magnetic resonance NMR, only considering applications in the kHz frequency domain, and only considering effects in the direction of production of a magnetic field, whereas nuclear magnetic resonance ranges over the kHz to GHz domain depending on the nuclear polarization field, and coils are used as detectors. That is, the authors failed to recognize the inverse action of a Lenz lens under the reciprocity theorem of magnetic resonance, i.e., the induction of current into a detector coil due to a precessing magnetization. In this disclosure, we detail how the concept can also be used to improve the detection of nuclear magnetic resonance signals, especially from small regions.

The Lenz lens effectively acts as a magnetic field "lever". This highly localized $\overline{B}_1$ field profile of the combined coil plus Lenz lens defines the most sensitive volume for NMR detection. By the theory of reciprocity (see Reference [3]), a precessing magnetization of the same spatial distribution as the $\overline{B}_1$ field profile of the coil (in the coil's sensitive volume) will induce an electromotive force in the accompanying coil, and its strength V(t) is by reciprocity the same as if an alternating voltage was applied to the coil in order to produce an equivalent magnetic field.

In summary then, the use of a Lenz lens, together with an NMR coil detector, possesses the following advantages:
  It localizes the sensitive volume of the combined assembly.
  It increases the local field efficiency $\overline{B}_1/I$ of the original coil detector by approximately the root radius ratio $f=\sqrt{r_{big}/r_{small}}$ of the Lenz lens.
  It is a broad band technique, working for samples independent of the resonance frequency of the excitation field, thus facilitating the study of samples through a range of field strengths.
  It provides a means for remote amplification, e.g., it may be encapsulated wholly within the sample, owing to the discrete nature of the lens itself.

The following lists some of the potential applications that could profit from the advantages of the Lenz lens, some of which have already been demonstrated and documented in experiments. Numerous further applications are expected:
  NMR microscopy on large samples in conjunction with a large sample-conformal NMR detector. We show that the Lenz lens, placed on a flexible substrate, could be used to separately move the focus of attention to a specific region (or regions) of interest, without moving the entire detector assembly.
  NMR microscopy of wounds. By placing a Lenz lens on a bandage or on a wound plaster, especially a Lenz lens with a transparent inner loop, the Lenz lens focus would always be properly aligned with the wound region of interest, and hence the assembly would be less susceptible to the accuracy of placement of the NMR detector.
  Implantable NMR microscopy. By implanting a Lenz lens, for example into the brain of a patient receiving invasive therapy but not limited to this application, the subsequent NMR inspection would benefit from the correct placement, high resolution, and wireless nature of the Lenz lens implant, making possible the long term monitoring of healing processes, or of disease advancement, or of the monitoring of tissue-device interactions for example for neural microprobes.

Complicated sample geometries. Sometimes the geometry of a technical or biological system does not facilitate the insertion of a wired device. For example, for technical systems such as microfluidics, or inside human arteries, or other confined spaces, it is desirable to obtain high resolution NMR signals. By placing a Lenz lens on a catheter, for example, or other interventional MR device, or inside a microfluidic assembly, and by placing externally a larger NMR sensor that completely encloses the assembly, such as the head of a patient, or a complete technical system, it remains possible to localize the SNR of the detector chain and thereby to achieve a very high fidelity NMR signal. We demonstrate this capability.

NMR microscopy for biopsies and cell cultures. By including a Lenz lens on a microscope glass slide, or on a culture dish, or on a well plate base (possibly including multiple regions of interest), we show that it is possible to achieve both transparency for optical microscopy, as well as enhanced NMR detection for NMR microscopy.

In homogeneities. By using micro- or nano-engineering to produce the Lenz lens, it is possible to achieve an exceptionally uniform effective $\overline{B}_1$ field in the focus of the Lenz lens, despite a perhaps less uniform field in the NMR detector. This is because the Lenz lens refocuses the flux through the use of a current, and the path of the current can be controlled very precisely using micromanufacturing and nano-manufacturing. We provide a number of exemplary demonstrations and NMR measurements.

Design for improved Lenz lens performance. We show that, by using numerical optimization, such as topology optimization, it is possible to take account of the coupling interaction between a Lenz lens and the outer NMR coil detector, and thereby achieve an optimal placement of the conductors of the Lenz lens to achieve even further fine tuning of the field homogeneity and flux leverage factor.

Design for novel Lenz lens arrangements. We show that, by using numerical optimization, such as topology optimization, it is possible to rearrange the Lenz lens topology so as to be able to be sensitive to multiple regions of interest, for example by using multiple Lenz lens loops, or to further improve $\overline{B}_1$ homogeneity, for example by using Helmholtz arrangements of Lenz lenses.

Further generalizations. Since many NMR detectors also exhibit fields outside of their primary region of interest, it is possible to conceive of an arrangement for the Lenz lens that also collects this flux. In order to do so, the Lenz lens can no longer be purely planar, but requires a cross-over loop so as to collect the outer flux with the correct sense, since the detector's outer $\overline{B}_1$ field will point in the opposite direction as it closes the magnetic field line loops. Especially for Helmholtz type detectors where the Lenz lens outer loop is ideally of a similar size to the Helmholtz loop, such an arrangement is very advantageous, because up to 50% more flux can thus be collected.

Waveguide NMR detectors. A Lenz lens can also be operated in conjunction with non-coil inductive NMR sensors, such as striplines (Reference [6]), or microslots (Reference [7]) etc. In such an arrangement, the Lenz lens can be used to locally modify the field density per unit length of the sensor in its most sensitive region, or to rotate the field locally to achieve more practical arrangements.

Magnetoinductive waveguides. A Lenz lens can be used in conjunction with a magnetoinductive waveguide, for example, to achieve a more efficient waveguiding principle, by better gathering flux around the waveguide elements, or by forming a more efficient termination of the magnetoinductive waveguide.

Metamaterials. It is possible to form materials into a metamaterial so as to achieve effective permeability properties that are not available with natural materials. In this context, a Lenz lens can for example be employed to achieve a very high local inductance value. Furthermore, Lenz lenses can be arranged in a metamaterial sense, so as to achieve regions with very strong shielding of magnetic field, and channeling of induction into areas where low losses are expected, thereby achieving efficient material arrangements.

Biochemistry sensor. By placing the lens on a substrate with material properties that are sensitive to the local chemical environment, it is possible to conceive of a device capable of remote detection of changes to this environment. Such a device may act as a switch with an 'off' state invisible to NMR and an 'on' state that can be detected by NMR (or vice versa) and located spatially within the sample, as well as temporally in the case of real-time imaging.

Tissue growth sensor. By placing the lens on a flexible substrate and affixing to damaged or diseased tissue, it is possible to conceive of a device capable of measuring morphological properties of the regrowth of healthy tissue or the proliferation of diseased tissue such as cancerous tumors (in addition to measuring chemical properties), by virtue of the changing morphology of the lens itself.

Field rotation for complex systems. By placing the inner element of the lens on a plane that lies at a non-zero angle θ to the plane of the outer element of the lens, it is possible to rotate the orientation of the field within the sensitive volume of the lens. Such an arrangement may allow the lens to access sample regions that are otherwise hindered by geometry constraints or magnetic shielding. For example, such an arrangement may be useful nearby metal implants or air cavities, or when the positioning of the external NMR detector is restricted and cannot be placed in such a way that the induced field is orthogonal to the primary static field of the NMR magnet.

Circular polarization. It is possible to take two lenses that have a single slit from the outside to the inside and to slide them into one another with their faces at right-angles. Such an arrangement would preserve circularly polarized waves and would therefore provide the Lenz lens benefit to quadrature excitation, such as when using birdcage coils.

Magnetic nanomanipulation. It is possible to move and steer 3D chiral magnetic particles (such as possessing of a screw or solenoidal arrangement) by magnetic field using a three-pair Helmholtz field arrangement (one pair of coils along each of the three orthogonal coordinate axes). By suitable arrangement, three orthogonally crossed Lenz lens arrangements placed within such a Helmholtz arrangement will focus the vector field to the inner region of the Lenz lens, essentially decomposing it into three Cartesian coordinates and then reinstating it within the focus region. This in turn will enable, due to the small size of the inner region, the steering of very small chiral particles in a very small volume. Furthermore, the field required in the Helmholtz arrangement need not be very high, due to the focusing and intensifying effect of the Lenz lens. This can for example be very interesting for interventional operation techniques, for example when operating in the eye or in inner organs.

Cross polarization, such as DNP. When applying cross polarization techniques, the same region in space must be subjected to two different radio-frequency signals. For some cases it is possible to double tune a resonator. When the frequencies are vastly different, such as is the case for dynamic nuclear polarization, or DNP, the effect is that the resonator for the lower frequency effectively screens the radiation at the higher frequency. A Lenz lens can be used to provide a path into the low frequency resonator, by having part of its structure extending outside of the low frequency resonator, and perpendicular to its excitation field for minimal interference.

Compact pulsed NMR device. It is possible to create very high magnetic fields (currently up to 100 T) for very short times by pulsing energy from a capacitor store through a resonant coil, but this requires a very expensive infrastructure. By creating a Lenz lens with a focusing factor f, it is possible to concentrate the flux of a coil, which generates a much lower (1/f) field strength into a region of interest. Because the high field is only within the Lenz lens, it could even be sacrificed as a consumable item during each pulsed experiment. Furthermore, by using a high field pulsed NMR experiment, an even higher field can be achieved by using a Lenz lens to focus the 100 T pulse into, for example, a 200 T field.

Any of the following methods could be used to produce Lenz lenses on a variety of substrates, for example glass, paper, or polymer, as well as on technical substrates made of composite materials:

Direct write inkjet printing. Inkjet printing (Reference [8]) is very suitable to produce temporary or permanent Lenz lens structures on flat or non-flat surfaces. The ink can either be a nanoparticulate ink (for example silver, or copper, or gold nanoparticles with a surfactant to avoid clumping of the particles), or it can be a chemical precursor of the metal. Subsequent thermal treatment will, for the case of nanoparticles, sinter them together into a continuous film, and for the case of a precursor ink, will promote the reaction to form a nanoparticular ink.

Liftoff. By forming the inverse shape of a Lenz lens using micro- or nano-lithography in for example a polymer resist layer, and anisotropically depositing a conducting metal layer onto the structure, so that the direct shape of the Lenz lens is formed permanently on a substrate, and subsequently removing the structure and thereby removing the inverse shape of the Lenz lens, one obtains a direct Lenz lens structure. If the deposition step produces thin metal layers, then the layer thickness can be increased for example using electroless or conventional galvanic electro-deposition.

Sputter and Lithography. By sputtering a metal film onto a substrate, and then forming a lithographic mask using a photoresist material on top which contains openings in the inverse shape of the Lenz lens, and then etching the metal in those areas where the photoresist does not cover the metal, it is possible to obtain one or more micro- or nano-structured Lenz lenses.

Milling. A metal film of sufficient thickness can be permanently fixed to a flexible or rigid substrate. Subsequently, the metal film can be milled so as to remove the inverse shape of the Lenz lens, but avoiding to mill away the substrate material.

Printed circuit board (PCB) manufacturing. Printed circuit board manufacturing of sufficient precision is very well suited for manufacturing Lenz lenses, especially if the PCB substrate material is a low-loss material as is available for the manufacture of radiofrequency components and circuits.

Laser machining. A metal film of sufficient thickness can be permanently fixed to a flexible or rigid substrate. By using a laser plotter with precise control over the position, size, strength, pulse frequency, and wavelength of the laser beam, it is possible to remove part of the metal film without affecting the underlying substrate. If the cut away shape is the inverse shape of a Lenz lens, a metallic Lenz lens is thereby formed. Additionally, a Lenz lens may be cut out of flexible metal foil where, prior to cutting, an adhesive layer or tape has been applied on one side of the metal foil. Thereby, a Lenz lens may be easily attached to arbitrary samples or objects.

It is possible to model analytically the induced current within the Lenz lens by calculating the electromotive force that is induced by an external field and matching this to the electric potential across the equivalent RL-circuit of the lens. For example, for a single lens placed half-way between and coaxial with two Helmholtz coil loops, the induced current in the lens, $I_L$, can be calculated as follows:

$$I_L = \frac{2i\omega(M_{BH} - M_{SH})I_H}{[R_L - i\omega(L_S + L_B - 2M_{SB})]}, \qquad (3.1)$$

where $\omega$ is the angular frequency, $I_H$ is the current in the Helmholtz loops, $R_L$ is the resistance of the lens, $L_S$ and $L_E$ are the self-inductances of the inner (S—small) and outer (B—big) loops of the lens, and $M_{BH}$, $M_{SH}$ and $M_{SE}$ are the mutual inductances between different combinations of the various loops (as denoted by the subscripts). Note that for high-frequency applications, the skin effect should be considered in the calculation of the resistance and self-inductance of the lens elements.

It is straightforward to extend the model to consider multiple lenses by introducing additional mutual inductance terms and considering each loop of the Helmholtz pair separately (H1 and H2). Note that the choice of using Helmholtz loops as the source of the external field has been made for demonstrative purposes only and the model described herein is also applicable for any external field, regardless of its source. The induced currents for all the lenses in the system (contained within vector $I_L$) can be obtained by solving a matrix equation of the form $\mathcal{L} I_L = H$, where the elements of matrix $\mathcal{L}$ and vector H are given by:

$$\mathcal{L}_{kk} = R_{Lk} - i\omega(L_{Sk} + L_{Bk} - 2M_{SkBk}) \qquad (3.2)$$

$$\mathcal{L}_{kj} = -i\omega(M_{BkBj} - M_{SkBj} - M_{BkSj} + M_{SkSj}) \qquad (3.3)$$

$$H_k = i\omega(M_{BkH1} + M_{BkH2} - M_{SkH1} - M_{SkH2})I_H, \qquad (3.4)$$

and k=1:K, j=1:K and j≠k, where K is the number of lenses. Note, for example, that $M_{SkBj}$ is the mutual inductance between the inner loop of the $k^{th}$ lens and the outer loop of the f$^{th}$ lens. This model can be used to predict the behaviour of the lens(es) and also to permit optimization of the geometry and placement of the lens(es), with respect to maximizing the gain in field sensitivity and/or other properties such as field homogeneity. Alternatively, it is also possible to model the system using finite element techniques.

Figure 21:
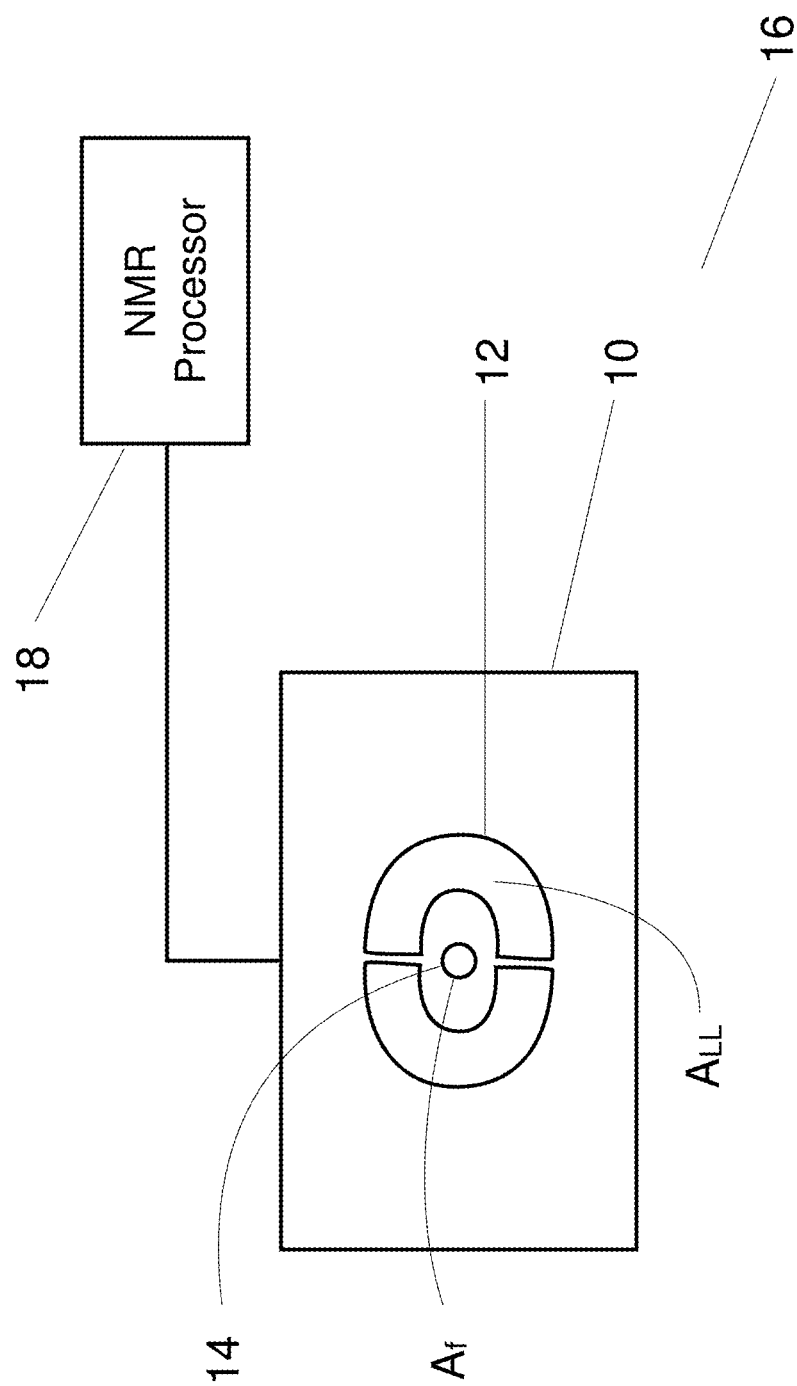
FIG. 21A shows a schematic side view of the RF coil system in accordance with the invention.
FIG. 21B shows a schematic top view of the RF coil system in accordance with the invention.

FIGS. 21A and 21B show schematic side (FIG. 21A) and top (FIG. 21B) views of the RF coil system 16 in accordance with the invention. The RF coil system 16 comprises an RF volume- or surface coil 10 which generates a magnetic field gi (indicated by double arrows). This magnetic field $\overline{B}_1$ is focused by an intermediate Lenz lens 12 onto an NMR sample 14. The intermediate Lenz lens defines an inner area $A_f$ proximate to the sample 14 as well as an outer area $A_{LL}$. Magnetic field $\overline{B}_1$ excites nuclear spins in the sample, which in turn, generate a magnetic field $\overline{B}_1'$ (indicated by single arrows). Magnetic field $\overline{B}_1'$ is focused by the intermediate Lenz lens 12 onto the RF volume- or surface coil 10, thereby inducing a current in that RF volume- or surface coil 10, which is passed on to NMR processor 18 for further evaluation and analysis.

REFERENCES

[1] Schoenmaker, J., K. R. Pirota, and J. C. Teixeira: *Magnetic flux amplification by Lenz lenses*. Review of Scientific Instruments, 84(8), 2013. http://dx.doi.org/10.1063/1.4819234.

[2] Webb, A. G.: *Radiofrequency microcoils in magnetic resonance*, Progress in Nuclear Magnetic Resonance Spectroscopy, 31(1):1-42, 1997, ISSN 0079-6565. http://dx.doi.org/10.1016/S0079-6565(97)00004-6.

[3] Hoult, D. I and R. E Richards: *The signal-to-noise ratio of the nuclear magnetic resonance experiment*. Journal of Magnetic Resonance (1969), 24(1):71-85, 1976, ISSN 0022-2364. http://dx.doi.org/10.1016/0022-2364 (76) 90233-X.

[4] Peck, T. L., Magin R. L., and Lauterbur P. C: *Design and Analysis of Microcoils for NMR Microscopy*, Journal of Magnetic Resonance, Series B, 108(2):114-124, 1995, ISSN 1064-1866. http://10.1006/jmrb.1995.1112.

[5] Olson D. L., Peck, T. L., Webb, A. G., Magin, R. L., and Sweedler, J. V.: *High-Resolution Microcoil 1H-NMR for Mass-Limited, Nanoliter-Volume Samples*, Science, 270 (5244):1967-1970, 1995. http://dx.doi.org/10.1126/science.270.5244.1967

[6] Maguire, Yael, Isaac L. Chuang, Shuguang Zhang, and Neil Gershenfeld: *Ultra-small-sample molecular structure detection using microslot waveguide nuclear spin resonance*. Proceedings of the National Academy of Sciences, 104(22):9198-9203, May 2007, ISSN 0027-8424, 1091-6490. http://dx.doi.org/10.1073/pnas.0703001104.

[7] Zhang, Xiaoliang, Kamil Ugurbil, and Wei Chen: *Microstrip RF surface coil design for extremely high-field MRI and spectroscopy*. Magnetic Resonance in Medicine, 46(3):443-450, September 2001, ISSN 1522-2594. http://dx.doi.org/10.1002/mrm.1212.

[8] Mager, D., A. Peter, L. Del Tin, E. Fischer, P. J. Smith, J. Hennig, and J. G. Korvink: *An mri receiver coil produced by inkjet printing directly on to a flexible substrate*. Medical Imaging, IEEE Transactions on, 29(2): 482-487, February 2010, ISSN 0278-0062. http://dx.doi.org/10.1109/TMI.2009.2036996.

[9] Sakellariou, D., G. Le Goff, and J. F. Jacquinot: *High-resolution, high-sensitivity NMR of nanolitre anisotropic samples by coil spinning*. Nature, 447(7145):694-697, June 2007, ISSN 0028-0836. http://dx.doi.org/10.1038/nature05897.

[10] Badilita, Vlad, Birgit Fassbender, Kai Kratt, Alan Wong, Christian Bonhomme, DimitrisSakellariou, Jan G. Korvink, and Ulrike Wallrabe: *Microfabricated inserts for magic angle coil spinning (MACS) wireless NMR spectroscopy*. PLoS ONE, 7(8):e42848, August 2012. http://dx.doi.org/10.1371/journal.pone.0042848.

We claim:

1. An NMR RF-coil system for detecting NMR RF signals emanating from a sample, the system comprising:
   an NMR RF (Radiofrequency) volume- or surface-coil adapted for receiving the NMR RF signals emanating from the sample;
   a passive Lenz lens disposed between the NMR RF volume- or surface-coil and the sample, the passive Lenz lens being coupled to the NMR RF volume- or surface-coil by substantially induction only, the passive Lenz lens having electrically conductive wires or faces containing an outer area defined by an outer edge, an inner edge and connecting edges, which, in operation, form a closed current loop enclosing a surface area penetrated by a time varying magnetic field flux from the NMR RF volume- or surface coil and, through induction, generates a time varying electrical current in a conducting loop so as to achieve a counter magnetic field to a penetrating magnetic field that tends to completely cancel the penetrating magnetic field in an interior of the closed loop, the inner edge of the closed current loop being shaped so as to guide an induced current in an opposite sense to the outer edge, thereby setting up a magnetic field flux in a same sense as the penetrating magnetic field but of an increased intensity, wherein a resulting time varying magnetic field flux is focused to an area enclosed by the inner edge; and
   an NMR processor, connected to the NMR RF volume- or surface-coil, the NMR processor disposed, structured and dimensioned to process current induced in the NMR RF volume- or surface-coil by NMR signals emanating from the sample and focused onto the NMR RF volume- or surface-coil by the passive Lenz lens.

2. The NMR RF-coil system of claim 1, wherein the RF-coil system is adapted for use in an MR (Magnetic Resonance) apparatus.

3. The NMR RF-coil system of claim 2, wherein the RF-coil is a saddle coil, a Helmholtz coil, a planar spiral coil, a solenoidal coil, a microslot, a birdcage or a stripline resonator.

4. The NMR RF-coil system of claim 1, wherein the passive Lenz lens is attached to a flexible, adhesive or non-adhesive substrate such as a foil that allows for bending, twisting or wrapping around an object in a permanent or non-permanent manner.

5. The NMR RF-coil system of claim 1, wherein a focal spot of the Lenz lens is split into multiple spots and/or a collecting area of the Lenz lens is split into multiple segments.

6. The NMR RF-coil system of claim 1, wherein the outer edge and inner edge lie on different geometrical planes which are parallel or not parallel to one another.

7. The NMR RF-coil system of claim 1, wherein the outer edge and/or the inner edge describe a different geometrical shape, a rectangle or a triangle.

8. The NMR RF-coil system of claim 1, wherein the passive Lenz lens is fabricated using bio-degradable materials, silk or magnesium, wherein a surface of the passive Lenz lens is coated with a bio-compatible material or with Parylene to allow for long-term tolerance to be implanted into an arbitrary sample or patient.

9. The NMR RF-coil system of claim 1, wherein a focus region of the Lenz lens is enclosed by a coil or waveguide resonator, creating a magnetic field $B_2'$ that is oriented perpendicular to the field created by a resonator $B_1$ and an outside region or flux-collecting region of the Lenz lens is exposed to a second magnetic field $B_2$ which oscillates at microwave frequencies.

10. The NMR RF-coil system of claim 1, wherein magnetic flux is also collected from outside of an enclosing coil.

11. The NMR RF-coil system of claim 1, wherein a sample and the focusing element are placed into a rotor of a magic angle spinning turbine or placed into a coil of a magic angle coil spinning, which, in turn, is placed into the rotor of a magic angle spinning turbine.

12. The NMR RF-coil system of claim 1, wherein the passive Lenz lens is formed by depositing a metal film onto a substrate, which is patterning to form a desired metal shape.

13. The NMR RF-coil system of claim 1, wherein the passive Lenz lens comprises a set of two or more passive Lenz lenses, each having the structure of claim 1, wherein an array of such passive Lenz lenses is placed above, below or next to each other.

14. The NMR RF-coil system of claim 1, wherein the passive Lenz lens comprises a set of two or more passive Lenz lenses, each having the structure of claim 1, which are placed at non-zero angles with respect to each other, with shared focal regions, so as to focus impinging fields that are incident on a resulting system from multiple directions, including circularly polarized waves.

15. A method of producing the passive Lenz lens of claim 1, wherein a mathematical equation or a system of equations is used to calculate a current induced in one or more of the passive Lenz lenses for purposes of simulation and/or optimization, wherein said equation or system of equations exactly or approximately accounts for electrical resistances and self-inductances of conductors comprising the Lenz lens(es), including skin-effects that may be relevant for radio frequency applications, and exactly or approximately accounts for mutual inductances between conductors comprising the Lenz lens(es) and also mutual inductances between the Lenz lens(es) and an NMR coil, wherein said equation or system of equations are dependent on a frequency of an impinging field.

16. A method of producing the passive Lenz lens of claim 1, wherein a best arrangement of the passive Lenz lens is calculated based on a forward method to compute fields of a Lenz lens together with a scalar objective function which is an expression whose value ideally vanishes when the Lenz lens has the best arrangement.

17. The NMR RF-coil system of claim 1, wherein the RF volume- or surface-coil and the NMR processor are also adapted to transmit RF signals into the sample.

* * * * *